US007030662B1

(12) United States Patent
Stiff

(10) Patent No.: US 7,030,662 B1
(45) Date of Patent: Apr. 18, 2006

(54) RAIL-TO-RAIL INPUT LINEAR VOLTAGE TO CURRENT CONVERTER

(75) Inventor: Jonathon Stiff, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/809,238

(22) Filed: Mar. 24, 2004

Related U.S. Application Data

(60) Provisional application No. 60/457,797, filed on Mar. 25, 2003.

(51) Int. Cl.
*H03B 1/00* (2006.01)

(52) U.S. Cl. ...................................... 327/103; 327/108

(58) Field of Classification Search ................ 327/100, 327/103, 108, 109, 110, 111, 112
See application file for complete search history.

(56) References Cited

U.S. PATENT DOCUMENTS 5,519,309 A * 5/1996 Smith ......................... 323/316
5,543,745 A * 8/1996 Notani ........................ 327/538
6,265,929 B1 * 7/2001 Hauser ....................... 327/404

* cited by examiner

*Primary Examiner*—Jeffrey Zweizig

(57) ABSTRACT

A voltage-to-current converter circuit is disclosed. In one embodiment, the present invention includes a first metal oxide semiconductor field effect transistor (MOSFET) stage operable in a low to medium power range. The present invention also includes a second MOSFET stage operable in a medium to high power range. An additive circuit is utilized to add the contributions of both the first MOSFET stage and the second MOSFET stage. A subtractive circuit is further used to subtract either the first MOSFET stage or the second MOSFET stage when both the first MOSFET stage and the second MOSFET stage are operating in the medium power range and outputting current in a voltage-to-current converting circuit.

19 Claims, 4 Drawing Sheets

TOP

400

RAIL-TO-RAIL INPUT LINEAR VOLTAGE TO CURRENT CONVERTER

RELATED U.S. APPLICATION

This application claims priority to the co-pending provisional patent application Ser. No. 60/457,797, entitled "A Rail-To-Rail Input Linear Voltage To Current Converter," with filing date Mar. 25, 2003, and assigned to the assignee of the present application. This application is hereby incorporated by reference.

FIELD OF THE INVENTION

Embodiments of the present invention relate generally to electronic circuitry and in particular to voltage-to-current converter circuits.

BACKGROUND OF THE INVENTION

Voltage-to-current converter circuits are commonly used in the design of analog and digital electronic circuits. Many embodiments of voltage-to-current converter circuits exist, and some have previously been patented. In general, a voltage-to-current converter takes a voltage as its input, and the circuit converts this to an output current.

One embodiment of a conventional voltage-to-current converter is shown in FIG. 1. This conventional circuit comprises three transistors and a resistor. The input voltage is coupled to the gate of a first transistor (M1). The drain of the first transistor is coupled to a resistor to ground. The source of the first transistor is coupled to the gates of a second (M2) and third (M3) transistor. The drain of the second transistor is coupled to the source of the first transistor. The sources of the second and third transistors are coupled to power. The drain of the third transistor is coupled to the output of this circuit.

The conventional circuit generates an output current by biasing the voltage across resistor R to approximately one NMOSFET (M1) threshold voltage less than the input voltage. By using the M1 NMOS input, the input impedance (the impedance of the gate) is large, and while M1 remains in the saturated state, the resistor voltage can remain independent of the state of the M2 PMOS, which generates a $V_{GS}$ (gate to source voltage) to mirror the resistor current to M3 and produce the output current at $I_{OUT}$. The current generated by the converter circuit 100 is shown in Eq. 1 and the input voltage range of the conventional voltage-to-current converter is shown in Eq. 2 and Eq. 3.

$$I_{OUT} = \frac{V_{IN} - V_{THN} - \sqrt{\frac{2 * I_{OUT}}{B_1}}}{R} \approx \frac{V_{IN} - V_{THN}}{R} \quad \text{Eq. 1}$$

$$V_{IN-MINIMUM} = V_{THN} \quad \text{Eq. 2}$$

$$V_{IN-MAXIMUM} = V_{PWR} + V_{THN} - V_{THP} - V_{DSAT} \quad \text{Eq. 3}$$

A disadvantage of the conventional technology is the limited input voltage range, which, from Eq. 2 and Eq. 3, is from approximately $V_{THN}$ (threshold voltage of a N-type MOSFET) to $V_{PWR}$ (power supply voltage). When working with low supply voltage, $V_{THN}$ (approximately 0.7V) can be a significant portion of $V_{PWR}$, leaving a very narrow input voltage range for the circuit. If the voltage-to-current converter is utilized as a linear tuning element, the narrowed input range forces a greater required change in output current for a given input voltage change, or slope, in order to cover the same output current range. Increasing the $I_{OUT}$ (output current)/$V_{IN}$ (input voltage) slope can have a negative impact on noise and noise sensitivity in the circuit and the systems of which it is part. For example, this voltage-to-current converter can be used as the front end of a voltage controlled oscillator in a PLL (phase lock loop). With a narrow input voltage range, the frequency versus voltage slope (or $K_{VCO}$, the gain of the voltage controlled oscillator) of the oscillator must be large compared to the $K_{VCO}$ using a wider input voltage range, in order to reach the required range of output frequencies. This, however, causes greater sensitivity to noise on the PLL loop filter resulting in higher PLL output jitter.

SUMMARY OF INVENTION

Thus, a need exists for a voltage-to-current converting circuit that is operational in a low voltage application. A further need exists for a voltage-to-current converter circuit with a wide input voltage range. Embodiments of the present invention provide these advantages.

A voltage-to-current converter circuit is disclosed. In one embodiment, the present invention includes a first metal oxide semiconductor field effect transistor (MOSFET) stage operable in a low to medium voltage range. The present invention also includes a second MOSFET stage operable in a medium to high voltage range. An additive circuit is utilized to add the contributions of both the first MOSFET stage and the second MOSFET stage for the output current. A subtractive circuit is further used to subtract either the first MOSFET stage or the second MOSFET stage when both the first MOSFET stage and the second MOSFET stage are operating in a portion of the medium voltage range and outputting current in a voltage-to-current converting circuit.

In this embodiment, the low voltage input stage is responsive to input voltages down to zero volts and upwards to $V_{PWR}$–$V_{TH}$. The high voltage input stage is responsive to input voltages of $V_{TH}$ to $V_{PWR}$. The combination of the stages provides a converter circuit that is responsive to input voltages from zero to $V_{PWR}$.

The resultant output current of the voltage-to-current converter circuit is linear versus input voltage over a wide range of voltage input values. Features of the voltage-to-current circuit include linear compensation achieved by subtracting the changing current from one portion of the circuit to the other, for example, the first and second MOSFET stages. This achieves linearity over the entire input voltage range, bridging from one voltage-to-current converter half operational input range to the other as discussed above. This is referred to as 'rail to rail' operation.

Another embodiment of the present invention provides a voltage to current converter circuit having a positive channel metal-oxide semiconductor (PMOS) stage operable in a low to medium power range. In addition, the circuit includes a negative channel metal-oxide semiconductor (NMOS) stage operable in a medium to high power range. An additive circuit is utilized to add contributions of both the NMOS stage and the PMOS stage from the low power range to the high power range to provide a rail-to-rail linear voltage-to-current converter. A subtractive circuit is also used to subtract either the NMOS stage or the PMOS stage when both the NMOS stage and the PMOS stage are operating in the medium power range in a voltage-to-current converting circuit.

In its various embodiments, the present invention provides a voltage-to-current converting circuit that is operational in a low voltage application. The present invention also provides a voltage-to-current converter circuit with a wide input voltage range.

BRIEF DESCRIPTION OF THE DRAWINGS

The accompanying drawings, which are incorporated in and form a part of this specification, illustrate embodiments of the invention and, together with the description, serve to explain the principles of the invention.

Conventional Art

DETAILED DESCRIPTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Figure 1:
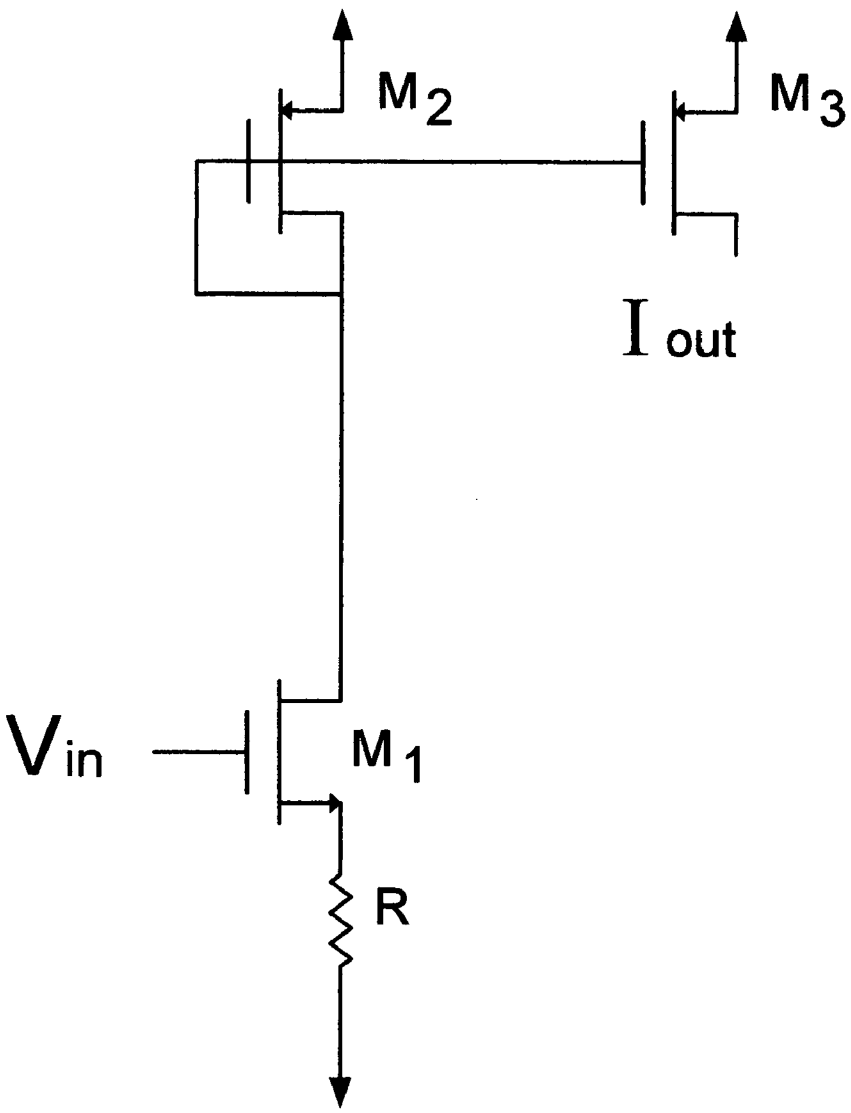
(Conventional Art) FIG. 1
FIG. 1 shows an embodiment of a conventional voltage-to-current converter.
Figure 2:
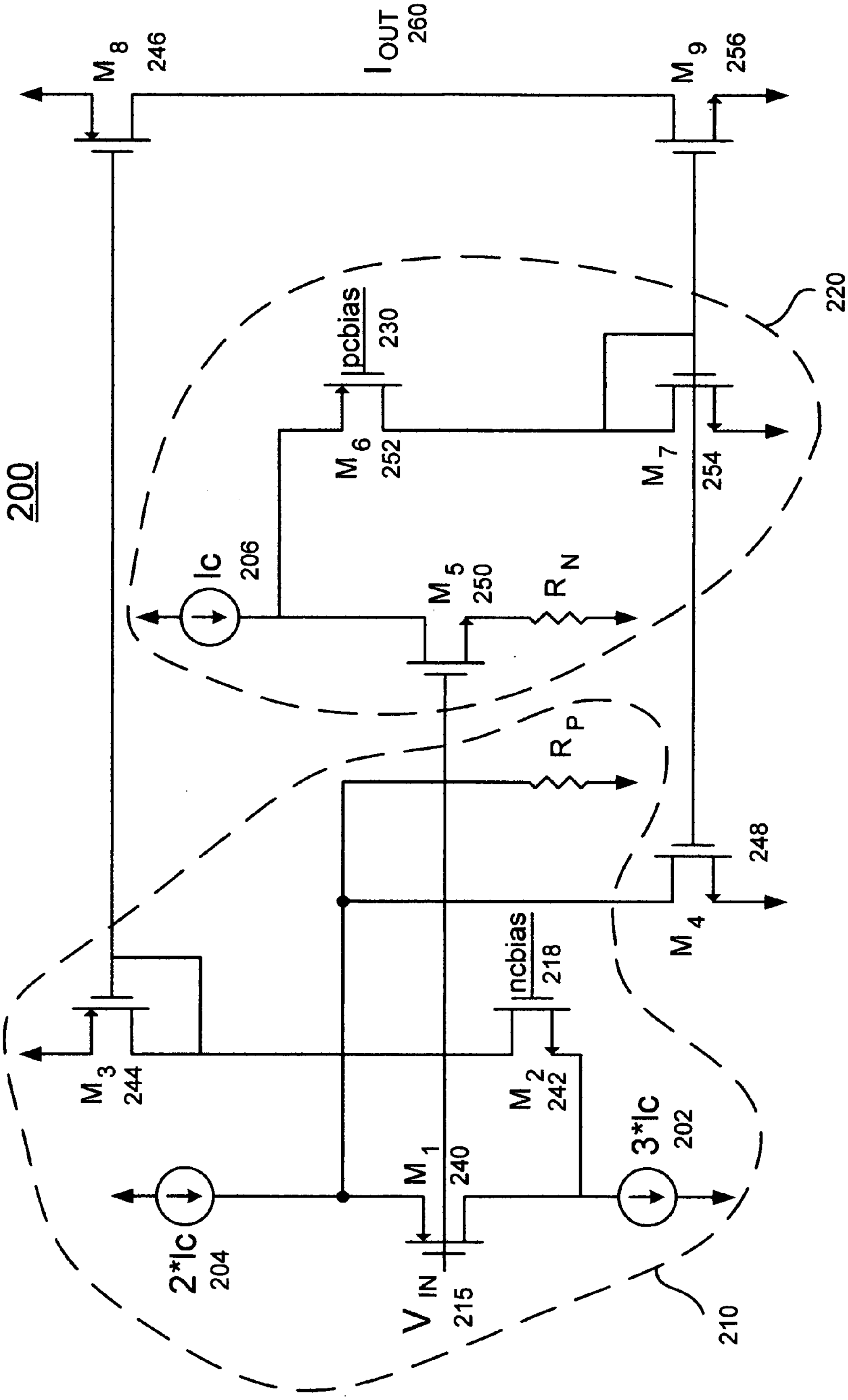
FIG. 2 shows a circuit diagram of an exemplary voltage-to-current converter circuit according to one embodiment of the present invention.

With reference now to FIG. 2, a circuit diagram of an exemplary voltage-to-current converter circuit 200 is shown in accordance with one embodiment of the present invention. This exemplary circuit comprises a first 202, second 204, and third 206 current source, and a first ($R_p$) and second ($R_N$) resistor. The circuit further comprises a first (M1) 240, second (M2) 242, third (M3) 244, fourth (M4) 248, fifth (M5) 250, sixth (M6) 252, seventh (M7) 254, eighth (M8) 246, and ninth (M9) 256 transistor. An input voltage 215 is coupled to the gates of the first 240 and fifth 250 transistors. The drain of the first transistor 240 is coupled to the first current source 202 to ground and draws three times Ic, and is coupled to the drain of the second transistor 242. The gate of the second transistor 242 is coupled to a bias voltage 'ncbias' 218. The source of the first transistor 240 is coupled to a second current source 204. The second current source 204 is coupled to power ($V_{PWR}$), sourcing twice Ic. The source of the second transistor 242 is coupled to the gate and drain of the third transistor 244, and the gate of the eighth transistor 246. The source of the third transistor 244 is coupled to power. The source of the eighth transistor 246 is coupled to power. The drain of the eighth transistor 246 is coupled to the source of the ninth transistor 256. The current that flows between the drain of the eighth transistor 246 and the source of ninth transistor 256 is $I_{OUT}$ 260, where $I_{OUT}$ 260 is the output of the voltage to current converter circuit 200.

The source of the fourth transistor 248 is coupled to the source of the first transistor 240 and to a first resistor ($R_p$). The first resistor ($R_p$) is also coupled to ground. The drain of the fourth transistor 248 is coupled to ground. The gate of the fourth transistor 248 is coupled to the gate of the seventh 254 and ninth transistors 256. The drains of the seventh 254 and ninth transistors 256 are each coupled to ground. The source of the fifth transistor 250 is coupled to the third current source 206. The third current source 206 is coupled to power ($V_{PWR}$), sourcing $I_C$. The source of the fifth transistor 250 is also coupled to the source of the sixth transistor 252. The drain of the fifth transistor 250 is coupled to a second resistor ($R_N$) to ground. The gate of the sixth transistor 252 is coupled to a bias voltage 'pcbias' 230. The drain of the sixth transistor 252 is coupled to the gate and source of the seventh transistor 254.

In operation, circuit 200 combines the output currents of a first MOSFET stage 210 and a second MOSFET stage 220 to achieve an input voltage range from 0V to $V_{PWR}$. Neglecting the presence of the body effect in the first MOSFET stage 210 and the second MOSFET stage 220, the output current versus input voltage slopes for both halves of the circuit are matched by using equivalent load resistors in each portion. Where the input voltage ranges of both voltage-to-current halves overlap, some circuit compensation is applied to prevent the output current being driven by both, doubling the output current slope over their overlapping input voltage range. In one embodiment, the first MOSFET stage 210 is a PMOS stage 210 and the second MOSFET stage 220 is an NMOS stage 220 of the voltage-to-current converter.

In one embodiment, the circuit is compensated by subtracting the output contribution from the second MOSFET stage 220 of the voltage-to-current converter portion of the circuit from the first MOSFET stage 210 portion of the circuit when both stages are active. Therefore, while the first MOSFET stage 210 portion continues to operate, it will remove the output current contributions of the second MOSFET stage 220 portion, via 248, effectively leaving the output current dependent only on the first MOSFET stage 210 portion. As the first MOSFET stage 210 portion reaches its maximum input voltage, additional increases in the input voltage no longer cause a proportional change in the first MOSFET stage 210 portion output current. In the embodiment shown in FIG. 2, this occurs when the first MOSFET stage 210 portion load resistor ($R_p$) consumes all the load bias current. Since no more bias current is available to source to MOSFET M1 240 and all further bias current increases due to the compensation circuit flow to the load resistor ($R_p$), the output current due to the first MOSFET stage 210 portion of the circuit saturates and becomes entirely dependent on the second MOSFET stage 220 portion. The transition between the two portions is smooth since both use identical load resistors ($R_p$ and $R_N$) (assuming no body effect), and the first MOSFET stage 210 portion "turns off", when all available current sourced to its load resistor ($R_p$), with little device distortion (e.g., MOSFET's falling out of saturation).

With reference still to FIG. 2, in one embodiment, the circuit 200 is optimized for operation at very low supply voltage and for generating current from a $V_{GND}$ (negative supply) referred input. The lower supply voltage capability is achieved by indirectly sensing currents by current subtraction in order to minimize the MOSFET threshold contribution in any $V_{PWR}$ (positive supply) to $V_{GND}$ (negative supply) path. The generated currents are referred to $V_{GND}$ by coupling resistors to $V_{GND}$ and placing the input voltage 215 (with approximately one MOSFET threshold offset) across them. This particular embodiment is also current limited such that it operates rail-to-rail over a fixed range of supply voltage.

Figure 3:
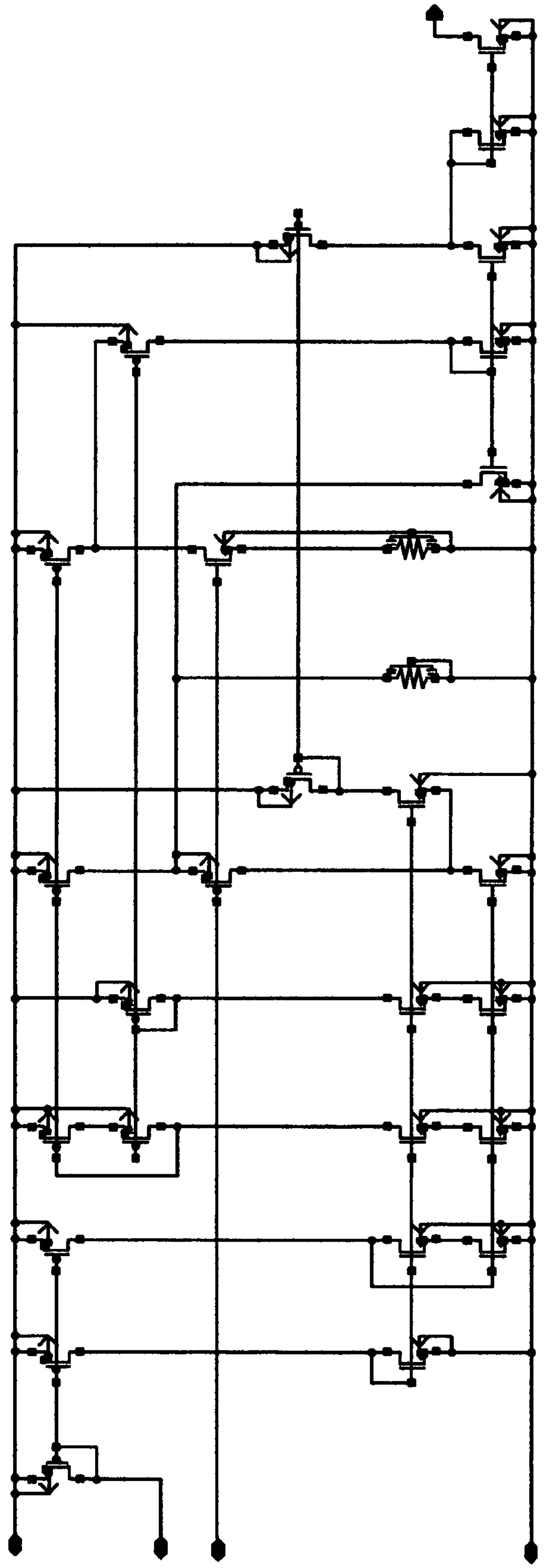
FIG. 3 shows a circuit diagram of an exemplary implementation of a voltage-to-current converter circuit in accordance with one embodiment of the present invention.

The embodiment described in FIG. 2 also utilizes several current sources that may be implemented with one or more MOSFETs whose offsets can be altered. The currents supplied by the sources allow output current variation in the two voltage-to-current halves with some input voltage $V_{IN}$ 215 operation overlap between the two. On the first MOSFET stage 210 side, the bias current and load resistor ($R_p$) is sized such that the first MOSFET stage 210 portion reaches its maximum input voltage before the load resistor ($R_p$) voltage pushes any of the bias current sources out of their high impedance current sourcing voltage range (for a MOSFET, out of saturation). An embodiment of the improved circuits using MOSFETs is shown in FIG. 3.

With reference still to FIG. 2, in one exemplary embodiment, a fixed current from current source 204 is applied to the first MOSFET stage 210. First MOSFET stage 210 generates additional current by using M1 240 to set a voltage on resistor $R_p$. Resistor $R_p$ will then steal current from fixed current source 204 and push it out the drain of M1 240 producing a current change that can be measured on M3 244. Therefore, if there is no $V_{IN}$ 215 applied to M1 240, the bias at M3 244 is $3*I_C$. However, if the $V_{IN}$ 215 applied to M1 240 is low the current mirroring through M3 244 is $I_C$ (e.g., a bias of $2*I_C$ is applied to the $3*I_C$ of the circuit). Therefore, M3 244 outputs a current range from $I_C$ to $3*I_C$ depending on the input voltage VIN 215. In one embodiment, M2 242 acts as a cascode to separate voltages on the drain of M1 240 and provides high impedance between M1 240 and M3 244. The following equations are provided as an example of one embodiment of the present invention.

Equations 1–3 illustrates the current through M3 244 based on $V_{IN}$ at M1 240.

$$I_{M1} = 2^* I_C - (V_{IN} - V_{TH}) / R_P \qquad \text{Eq. 1}$$

$$I_{M3} = 3^* I_C - I_{M1} \qquad \text{Eq. 2}$$

Where $M3$ 244 increases with $(V_{IN} - V_{TH}) / R_P$ $$I_{M3} = I_C + (V_{IN} - V_{TH}) / R_P \qquad \text{Eq. 3}$$

In general, the above description and equations show how input voltage ($V_{IN}$ 215) affects the current $I_{M3}$ through M3 244. In one embodiment, the $V_{IN}$ input range of M1 240 is 0 volts to $V_{MAX}=V_{PWR}-V_{TH}$. The current through M3 is mirrored to M8.

With respect still to FIG. 2, and now to the second MOSFET stage 220, in one embodiment, the operation of the second MOSFET stage 220 is similar to that of first MOSFET stage 210 except it operates on the medium to high voltage input 215, wherein the first MOSFET stage 210 operates on the low to medium voltage input 215. Moreover, in one embodiment, the bias voltage 'pcbias' 230 is used to set a bias on M6 252 such that M5 250 drain voltage remains reasonable. Without M6 252, the voltage felt on the drain of M5 250 would be biased based on the diode connected M7 254 which would significantly reduce the input voltage range of M5 by taking it out of saturation. By using M6 252, the voltage maintained on the drain of M5 250 can be fairly close to $V_{PWR}$, keeping M5 saturated over the entire input voltage range of M5.

The final addition of the currents (e.g., $I_O$ 260) from both first MOSFET stage 210 and second MOSFET stage 220 comes from the transistors M8 246 and M9 256 (e.g., the additive circuit). This current output (e.g., $I_O$ 260) may be measured or used either directly or by mirroring the current $I_O$ 260 to another circuit that could then measure or utilize the converted current. However, another connection is necessary to resolve the current spike in $I_O$ 260 that would occur when both the first MOSFET stage 210 and the second MOSFET stage 220 are operational in the mid-voltage range. That is, as stated herein, both the first MOSFET stage 210 and the second MOSFET stage 220 have overlapping ranges, and if left unadjusted, at the overlap a current spike would occur in the slope of the graph of the input voltage versus the output current (e.g., FIG. 4).

For example, the slope of the input voltage versus the output current is based on the equation slope (e.g., $I_O$ 260)$=V_{IN}/R$. Thus, the slope is determined by R where $R=R_N=R_p$, and it is appreciated that without further circuitry, when both are working the overlap current versus voltage slope would double. In order to resolve the spike in $I_O$ 260 when both the first MOSFET stage 210 and the second MOSFET stage 220 are operational a subtractive circuit is used. In one embodiment, the current in M7 254 (and therefore M8 256) is mirrored to M4 248 (the regulator) and then subtracted from the first MOSFET stage 210 of the circuit 200. Therefore, at the point that both the first MOSFET stage 210 and the second MOSFET stage 220 are operational, the current generated by the second MOSFET stage 220 is subtracted from the first MOSFET stage 210 via M4 248 and it will therefore effect equal change to Mg 246 and M9 256. That is, any gains of the second MOSFET stage 220 are removed by the first MOSFET stage 210 via M4 248 thereby keeping the voltage-to-current slope linear over the input range.

The counter affect of the first MOSFET stage 210 versus the second MOSFET stage 220 is maintained until the end of the first MOSFET stage 210's operational input voltage range. Then when all source 204 current is diverted to resistor $R_p$, no current flows through MOSFET M1 and the first MOSFET stage 210 effectively turns off. Since the first MOSFET stage 210 was canceling the current from second MOSFET stage 220, when the first MOSFET stage 210 shuts off, the second MOSFET stage 220 seamlessly takes over the generation of $I_O$ 260, as the current being removed by M4 248 is no longer being removed.

Figure 4:
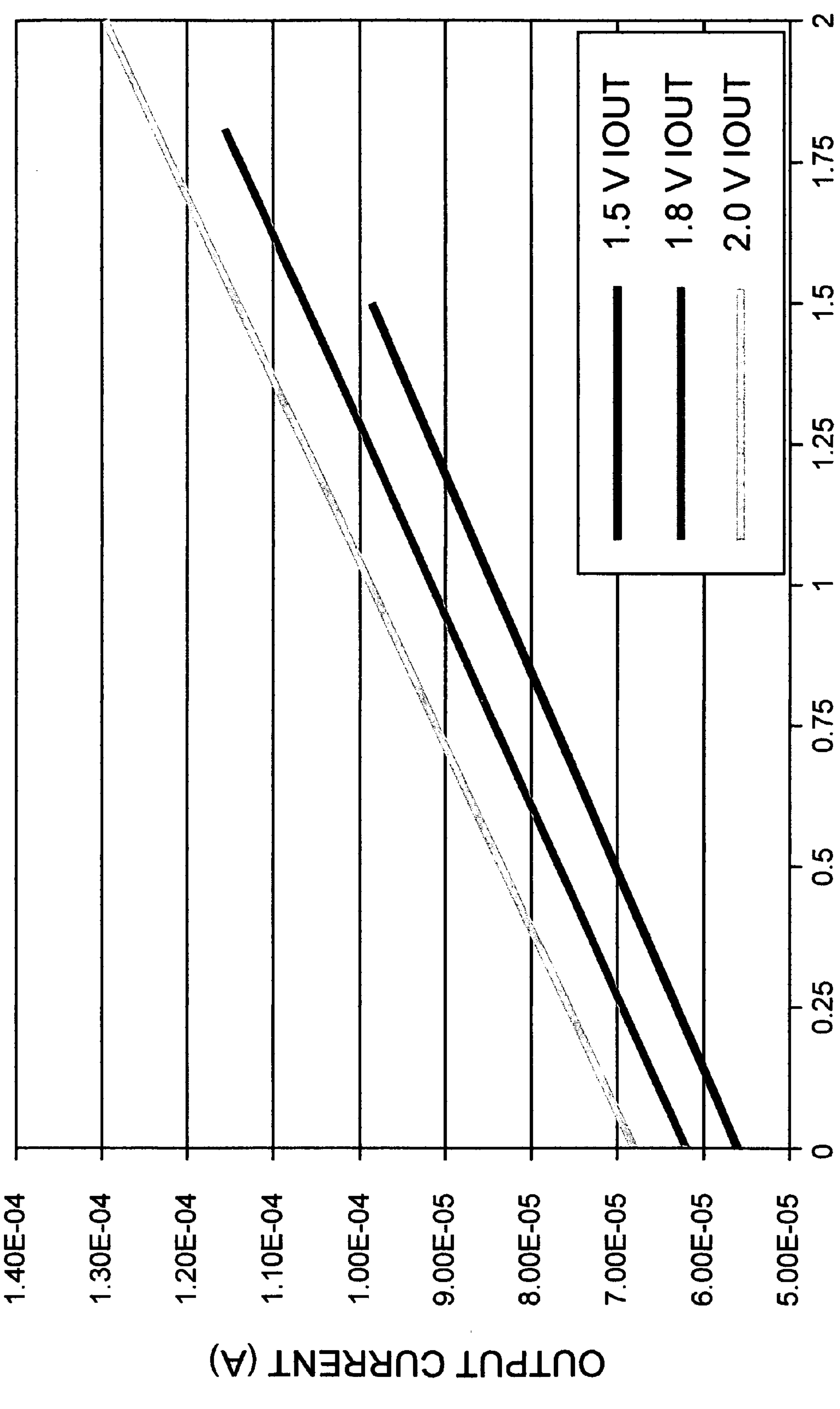
FIG. 4 shows a graph of simulation results showing $I_{OUT}$ versus $V_{IN}$ for example low $V_{PWR}$ values of an exemplary voltage-to-current converter circuit according to one embodiment of the present invention.

With reference now to FIG. 4, a graph 400 of output current (with added offset for display purposes, e.g., separation of 3 graphed portions) versus input voltage is displayed for the embodiment shown in FIG. 3. This output demonstrates the exceptionally linear output current versus input voltage characteristic of the improved circuit over several positive power supply ($V_{PWR}$) voltage values.

Graph 400 is a linear response of the current output to the voltage input. As is shown in graph 400, the rail-to-rail voltage-to-current is linear throughout the entire range of the voltage inputs shown. Not only does graph 400 show a linear output current versus input voltage over the entire voltage range of the power supply voltage, it further shows the linear current versus input voltage over the entire range of LOW power including below an NMOSFET threshold voltage (in one example an NMOSFET threshold is 0.7V). Therefore, the present invention operates linearly at voltages below which other voltage-to-current conversion circuits are even operational.

The circuit of the present invention may be used, for example, to generate the control current in a current controlled oscillator when an effective voltage controlled oscillator is desired. The improved circuit can be utilized to generate a current proportional (with or without a fixed offset) to an input voltage for any application required.

An advantage of the circuit of the present invention is that it provides a much greater linear input range voltage range than other voltage-to-current converters and does so without using an amplifier in a compensated feedback loop. This allows the voltage-to-current conversion to operate much faster and without the complexity of a high gain amplifier or ensuring feedback loop stability. Both of these features make the improved circuit highly desirable in a PLL (phase lock look) or DLL (delay lock loop) design as the front end of a voltage controlled oscillator.

In alternative embodiments of the improved circuit, the load resistors utilized in the improved circuit can be implemented using any integrated circuit process resistor types (such as, but not limited to, diffusion, polysilicon, or metal), an active resistance composed of a plurality of MOSFETs, bipolar transistors, and diodes, or with a discrete resistor. These embodiments and others not explicitly specified here are envisioned by this improved embodiment.

One embodiment of the improved circuit may be implemented using MOSFETs. In another alternative embodiment, this improved circuit may be implemented by interchanging NMOSFETs and PMOSFETs, and $V_{PWR}$ for $V_{GND}$. In yet another embodiment, some or all MOSFETs may be replaced with bipolar transistors. In yet another embodiment the current sources shown in FIG. 2 may be implemented with a plurality of MOSFETs or bipolar devices, or may be provided externally by the combination of one or more currents.

Features of the improved circuit include linear compensation achieved by subtracting the changing current from one stage of the circuit to the other. This achieves linearity over the entire input voltage range, bridging from one voltage-to-current converter half operational input range to the other. This is referred to as 'rail to rail' operation.

A further feature of improved circuit is that it may replace voltage-to-current converters in existing voltage-controlled oscillators to provide a much wider input voltage range. By having a wider input voltage range, the frequency versus control voltage slope ($K_{VCO}$) for the oscillator can be reduced which can reduce jitter in phase locked loops (PLLs) using this oscillator. This improved circuit is valuable in very low supply voltage IC processes to provide a maximum input voltage tuning range.

Thus, embodiments of the present invention provide a voltage-to-current converting circuit that is operational with good range in a low voltage application. The present invention also provides a voltage-to-current converter circuit with a wide input voltage range.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A voltage-to-current converter circuit comprising:

a first metal oxide semiconductor field effect transistor (MOSFET) stage operable in a low to medium input voltage range;

a second MOSFET stage operable in a medium to high input voltage range;

an additive circuit to add current contributions of both the first MOSFET stage and the second MOSFET stage; and a subtractive circuit for causing said second MOSFET stage contribution to be subtracted from said first MOSFET stage contribution when both said first MOSFET stage and said second MOSFET stage are operating in a portion of the medium voltage range.

2. The circuit of claim 1 wherein said first MOSFET stage comprises:

a voltage input node at a first MOSFET;

a first current source coupled with the drain of said first MOSFET;

a second current source coupled with the source of said first MOSFET;

a second MOSFET coupled with the drain of said first MOSFET;

a resistor coupled with the source of the first MOSFET;

a bias voltage coupled with the gate of said second MOSFET;

a third MOSFET having a gate and drain coupled with a source of said second MOSFET; and a fourth MOSFET mirrored to said third MOSFET.

3. The circuit of claim 1 wherein said second MOSFET stage comprises:

a voltage input node at a first MOSFET;

a current source coupled with the source of said first MOSFET;

a second MOSFET source coupled with the source of said first MOSFET;

a resistor coupled with the drain of the first MOSFET;

a bias voltage coupled with the gate of said MOSFET;

a third MOSFET having a gate and source coupled with said second MOSFET; and a fourth MOSFET mirrored to said third MOSFET.

4. The circuit of claim 1 wherein said additive circuit generates an output current and operates from the low voltage range to the high voltage range to provide a rail-to-rail linear voltage-to-current output.

5. The circuit of claim 1 wherein said additive circuit combines an output current of said first MOSFET stage with the output current of said second MOSFET stage to achieve a linear current slope for an input voltage range from 0V to a maximum voltage (VPWR).

6. The circuit of claim 5 wherein the output current versus input current slopes for both said first MOSFET stage and said second MOSFET stage of the circuit are matched using an equivalent load resistor in both said first MOSFET stage and said second MOSFET stage.

7. The circuit of claim 1 wherein said subtractive circuit comprises a first MOSFET with a gate coupled with the gate of a current output MOSFET of the second MOSFET stage and a source coupled with a source of a current output MOSFET of the first MOSFET stage.

8. The circuit of claim 7 wherein when both the first MOSFET stage and the second MOSFET stage are operational, the first MOSFET stage removes the output current contributions of the second MOSFET stage using the subtractive circuit leaving the output current of the circuit dependent only on the FIRST second MOSFET stage contribution.

9. A voltage to current converter circuit comprising:

a positive channel metal-oxide semiconductor (PMOS) stage operable in a low to medium voltage range;

a negative channel metal-oxide semiconductor (NMOS) stage operable in a medium to high voltage range;

an additive circuit to add current contributions of both the NMOS stage and the PMOS stage from the low voltage range to the high voltage range to provide a rail-to-rail linear voltage-to-current output; and a subtractive circuit to subtract said NMOS stage current contribution when both said NMOS stage and said PMOS stage are operating in the medium voltage range.

10. The circuit of claim 9 wherein said PMOS stage comprises:

a voltage input node at a first PMOS transistor;

a first current source coupled with the drain of said first PMOS transistor;

a second current source coupled with the source of said first PMOS transistor;

a resistor coupled with the source of the first PMOS transistor;

an NMOS transistor drain coupled with the drain of said first PMOS transistor;

a bias voltage coupled with the gate of said NMOS transistor;

a second PMOS transistor having a gate and drain coupled with a source of said NMOS transistor; and a third PMOS transistor mirrored to said second PMOS transistor.

11. The circuit of claim 9 wherein said NMOS stage comprises:

a voltage input node at a first NMOS transistor;

a current source coupled with the source of said first NMOS transistor;

a PMOS transistor source coupled with the source of said first NMOS transistor;

a resistor coupled with the drain of the NMOS transistor;

a bias voltage coupled with the gate of said PMOS transistor;

a second NMOS transistor having a gate and source coupled with said PMOS transistor; and a third NMOS transistor mirrored to said second NMOS transistor.

12. The circuit of claim 9 wherein said additive circuit combines an output current of said PMOS stage with the output current of said NMOS stage to achieve a linear current slope for an input voltage range from 0 Volts to a maximum voltage (VPWR).

13. The circuit of claim 12 wherein the output current versus input current slopes for both said PMOS stage and said NMOS stage of the circuit are matched using an equivalent load resistor in both said PMOS stage and said NMOS stage.

14. The circuit of claim 9 wherein said subtractive circuit comprises a first NMOS transistor with a gate coupled with the gate of a current output NMOS transistor of the NMOS stage and a source coupled with a source of a current output PMOS transistor of the PMOS stage.

15. The circuit of claim 14 wherein when both the PMOS stage and the NMOS stage are operational, the PMOS stage will remove the output current contributions of the NMOS stage using the subtractive circuit leaving the output current of the circuit dependent only on the PMOS stage contribution.

16. The circuit of claim 15 wherein when both the PMOS stage and the NMOS stage are operational, the NMOS stage will remove the output current contributions of the PMOS stage using the subtractive circuit leaving the output current of the circuit dependent only on the NMOS stage contribution.

17. A voltage-to-current converter circuit comprising:

a first voltage-to-current converter circuit operational from a low to a mid input voltage range;

a second voltage-to-current converter circuit operational from a mid to a high input voltage range; and a current compensation circuit coupled with said first and second voltage-to-current converter circuits, wherein said current compensation circuit removes the input of said second voltage-to-current converter during the mid voltage range when both said first and said second voltage-to-current converters are operational.

18. The voltage-to-current converter of claim 17 further comprising:

a current additive circuit coupled with said first and said second voltage-to-current converter circuits, wherein said current additive circuit outputs the current from both the first and the second voltage-to-current converter circuits as a linear current slope for an input voltage ranging from 0 Volts to a maximum voltage (Vpwr).

19. The voltage-to-current converter of claim 17, wherein when both the first and said second voltage-to-current converter circuits are operational, the current compensation circuit will remove the output current contributions of the second voltage-to-current converter circuit leaving the output current of the voltage-to-current converter circuit dependent only on the first voltage-to-current converter circuit contribution.

* * * * *